United States Patent
Baumgartner et al.

(10) Patent No.: US 6,567,962 B2
(45) Date of Patent: May 20, 2003

(54) METHOD, APPARATUS, AND PROGRAM FOR MULTIPLE CLOCK DOMAIN PARTITIONING THROUGH RETIMING

(75) Inventors: Jason Raymond Baumgartner, Austin, TX (US); Robert Neill Newshutz, Rochester, MN (US); Steven Leonard Roberts, Austin, TX (US); Anson Jeffrey Tripp, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 148 days.

(21) Appl. No.: 09/726,289

(22) Filed: Nov. 30, 2000

(65) Prior Publication Data

US 2002/0066065 A1 May 30, 2002

(51) Int. Cl.[7] .................................. G06F 17/50
(52) U.S. Cl. ................... 716/6; 716/7; 716/11; 716/16; 716/18
(58) Field of Search ............ 716/1–21; 327/147; 375/240.23; 703/14, 19, 23; 711/1; 712/209; 714/1, 33

(56) References Cited

U.S. PATENT DOCUMENTS 6,117,183 A * 9/2000 Teranishi et al. ............. 716/11

* cited by examiner

Primary Examiner—Matthew Smith
Assistant Examiner—Helen B Rossoshek
(74) Attorney, Agent, or Firm—Duke W. Yee; Mark E. McBurney; Stephen R. Tkacs

(57) ABSTRACT

An apparatus performs a process for partitioning a netlist. The process picks a unique color for each clock and traverses the clock tree coloring the latches in support of that clock tree with that color. The process then colors the fanout logic cones for each latch and notes any coloring collisions. In the case of a multicolored gate, the process retimes the network by moving the terminating latch backwards, towards the collision, to enable single coloring of the gate. The process then performs a depth-first search on the fanout logic of each primary input to the first latch encountered or a primary output. If a primary output is encountered, the path is colored with a color representing the free-run domain. Otherwise, the process colors the path with the color of the terminating latch. Next, the process duplicates the fanin cones for remaining multicolored gates so that a copy of the logic can be incorporated with each independent domain.

22 Claims, 2 Drawing Sheets

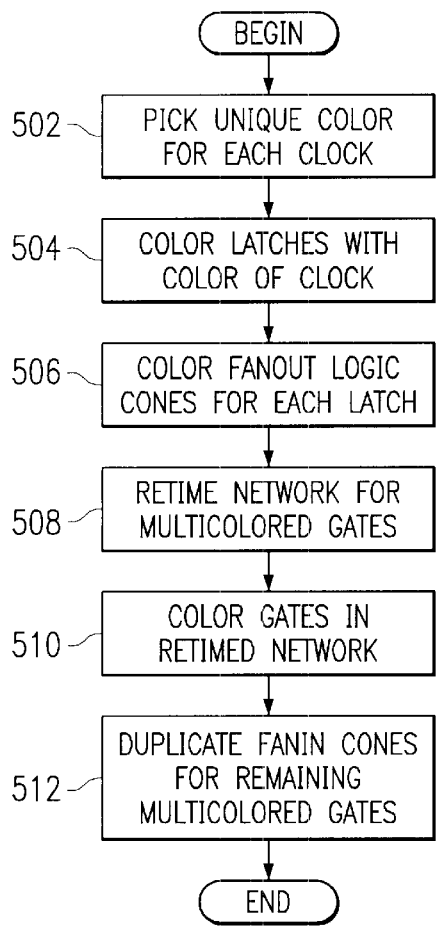
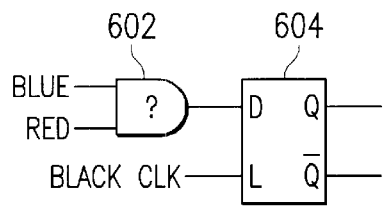
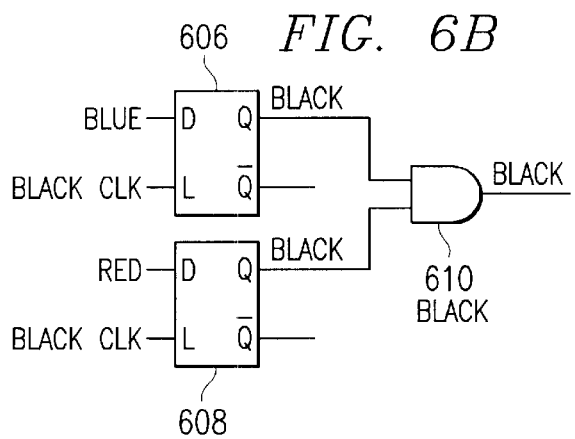
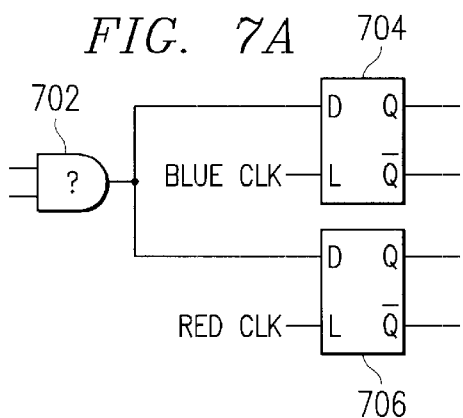
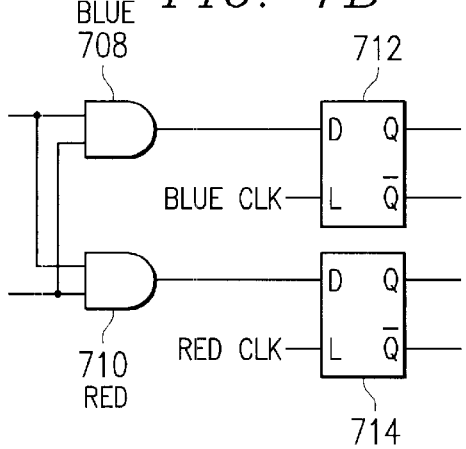

METHOD, APPARATUS, AND PROGRAM FOR MULTIPLE CLOCK DOMAIN PARTITIONING THROUGH RETIMING

BACKGROUND OF THE INVENTION

1. Technical Field

The present invention relates to a circuit simulation and emulation and, in particular, to circuits with multiple clock domains. Still more particularly, the present invention provides a method, apparatus, and program for retiming netlists to partition multiple clock domains.

2. Description of Related Art

Incubated in the verification of digital signal processing and graphics manipulation, emulation technologies are poised for high growth as more companies exploit their ability to run long test vector sequences on hardware models at speeds that allow integration with fabricated periphery devices. The emulation hardware is used in two ways: 1) accelerated simulation where the test vectors are sent and results processed from a host machine; and, 2) in-circuit emulation (ICE) where the inputs and outputs are connected to the periphery devices. The speedups over traditional simulation are significant.

Currently, two different emulator architectures dominate the market: processor array emulators and field programmable gate array (FPGA) based emulators. FPGA emulators allow for netlists to be programmed into multiple function logic cells. Netlists are high level descriptions of a hardware design which include the intended functionality. These cells are then strategically placed within the emulator so that they can be connected together by the wires running between the FPGAs. Currently, FPGA emulation is speed limited due to the technology rather than the netlist size. In fact, in FPGA systems, the gate utilization is low due to the complications involved in routing the FPGA interconnect.

Processor array based emulators map a netlist to the memory spaces associated with each processor. The netlist is evaluated by synchronously stepping through the instructions in the memory space and scheduling communication on a fixed interconnect during a communication phase. This technology has slow throughput time, but much better compile time and more than five times the capacity of FPGA based systems.

Based on the observation that the capacity demands are often driven by the desire to emulate system level hardware, the idea has been proposed in the prior art to emulate each asynchronous system component independently such that the in-circuit hardware could interact with the smaller domains, thus increasing the frequency of each domain, and the emulation model as a whole. However, given an asynchronous netlist, the task of identifying appropriate cutpoints that maintain the full range of functionality is not trivial with respect to the handling of the combination paths between the logic driven by different clocks.

In particular, when signals from domains clocked by different latches fan-in to a new latch domain, it is difficult to determine how to schedule the evaluation of the logic on the combinational path between clock domains. A combinational path is a sequence of gates that provides a new output whenever the input changes. For instance, an AND gate will change from high to low almost instantaneously when one or both of its inputs tranistions to low. These devices do not require a clock. A combinational path will not include a latch. The prior art deals with this situation by replication of the combinational paths and grouping the replicated logic with its respective input domain. Due to the logic duplication, this approach can increase the model size dramatically in logic that has large combinational paths between latch boundaries. Model size can also increase due to the lost optimization potential in grouping the input cones together.

Thus, it would be advantageous to reduce duplication in the emulation of circuits with multiple clock domains.

SUMMARY OF THE INVENTION

The present invention provides a technique for partitioning a netlist. The present invention picks a unique color for each clock and traverses the clock tree coloring the latches in support of that clock tree with that color. Thereafter, all latches should be colored. The present invention then colors the combinational fanout cones for each latch and notes any coloring collisions. In the case of a multicolored gate, the present invention retimes the network by moving the terminating latch backwards, towards the collision, to enable single coloring of the gate. The present invention then performs a depth-first search on the fanout logic of each primary input to the first latch encountered or a primary output. If a primary output is encountered, the path is colored with a color representing the free-run domain. Otherwise, the present invention colors the path with the color of the terminating latch. Next, the present invention duplicates the fanin cones for remaining multicolored gates so that a copy of the logic can be incorporated with each independent domain.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 5 is a flowchart is shown illustrating the operation of a retiming process in accordance with a preferred embodiment of the present invention; and FIGS. 6A and 6B show exemplary circuits that are retimed by duplicating latches in accordance with a preferred embodiment of the present invention.

FIGS. 7A and 7B show exemplary circuits that are retimed by duplicating the fanin cone of a multicolored gate in accordance with a preferred embodiment of the present invention.

DETAILED DESCRIPTION OF THE PREFERRED EMBODIMENT

Figure 1:
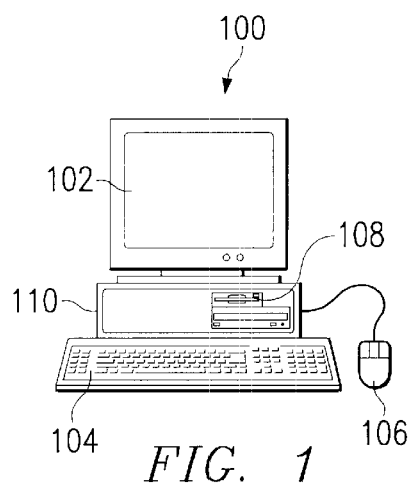
FIG. 1 is a pictorial representation of a data processing system in which the present invention may be implemented in accordance with a preferred embodiment of the present invention.

With reference now to the figures and in particular with reference to FIG. 1, a pictorial representation of a data processing system in which the present invention may be implemented is depicted in accordance with a preferred embodiment of the present invention. A computer 100 is depicted which includes a system unit 110, a video display terminal 102, a keyboard 104, storage devices 108, which may include floppy drives and other types of permanent and removable storage media, and mouse 106. Additional input devices may be included with personal computer 100, such as, for example, a joystick, touchpad, touch screen, trackball, microphone, and the like. Computer 100 can be implemented using any suitable computer, such as an IBM RS/6000 computer or IntelliStation computer, which are products of International Business Machines Corporation, located in Armonk, N.Y. Although the depicted representation shows a computer, other embodiments of the present invention may be implemented in other types of data processing systems, such as a network computer. Computer 100 also preferably includes a graphical user interface that may be implemented by means of systems software residing in computer readable media in operation within computer 100.

Figure 2:
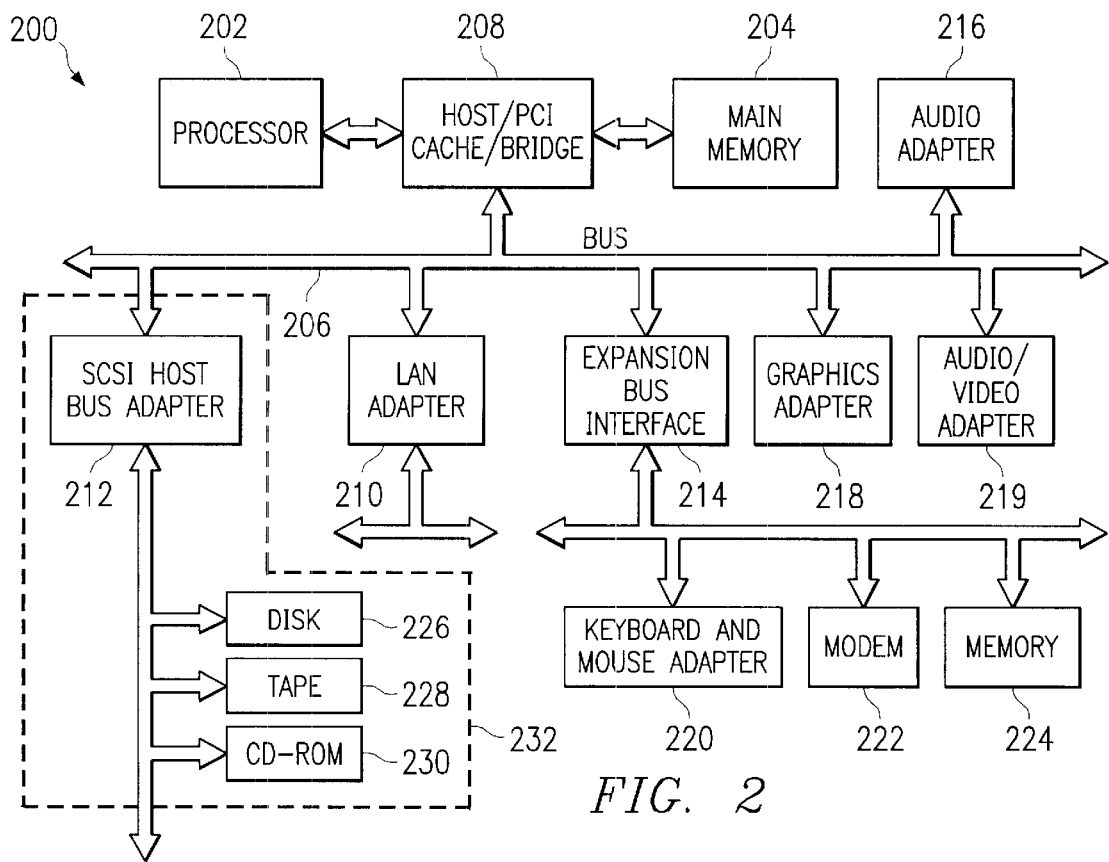
FIG. 2 is a block diagram of a data processing system in which the present invention may be implemented.

With reference now to FIG. 2, a block diagram of a data processing system is shown in which the present invention may be implemented. Data processing system 200 is an example of a computer, such as computer 100 in FIG. 1, in which code or instructions implementing the processes of the present invention may be located. Data processing system 200 employs a peripheral component interconnect (PCI) local bus architecture. Although the depicted example employs a PCI bus, other bus architectures such as Accelerated Graphics Port (AGP) and Industry Standard Architecture (ISA) may be used. Processor 202 and main memory 204 are connected to PCI local bus 206 through PCI bridge 208. PCI bridge 208 also may include an integrated memory controller and cache memory for processor 202. Additional connections to PCI local bus 206 may be made through direct component interconnection or through add-in boards. In the depicted example, local area network (LAN) adapter 210, small computer system interface SCSI host bus adapter 212, and expansion bus interface 214 are connected to PCI local bus 206 by direct component connection. In contrast, audio adapter 216, graphics adapter 218, and audio/video adapter 219 are connected to PCI local bus 206 by add-in boards inserted into expansion slots. Expansion bus interface 214 provides a connection for a keyboard and mouse adapter 220, modem 222, and additional memory 224. SCSI host bus adapter 212 provides a connection for hard disk drive 226, tape drive 228, and CD-ROM drive 230. Typical PCI local bus implementations will support three or four PCI expansion slots or add-in connectors.

An operating system runs on processor 202 and is used to coordinate and provide control of various components within data processing system 200 in FIG. 2. The operating system may be a commercially available operating system such as Windows 2000™. An object oriented programming system such as Java™ may run in conjunction with the operating system and provides calls to the operating system from Java programs or applications executing on data processing system 200. Instructions for the operating system, the object-oriented programming system, and applications or programs are located on storage devices, such as hard disk drive 226, and may be loaded into main memory 204 for execution by processor 202.

Those of ordinary skill in the art will appreciate that the hardware in FIG. 2 may vary depending on the implementation. Other internal hardware or peripheral devices, such as flash ROM (or equivalent nonvolatile memory) or optical disk drives and the like, may be used in addition to or in place of the hardware depicted in FIG. 2. Also, the processes of the present invention may be applied to a multiprocessor data processing system.

For example, data processing system 200, if optionally configured as a network computer, may not include SCSI host bus adapter 212, hard disk drive 226, tape drive 228, and CD-ROM 230, as noted by dotted line 232 in FIG. 2 denoting optional inclusion. In that case, the computer, to be properly called a client computer, must include some type of network communication interface, such as LAN adapter 210, modem 222, or the like. As another example, data processing system 200 may be a stand-alone system configured to be bootable without relying on some type of network communication interface, whether or not data processing system 200 comprises some type of network communication interface. As a further example, data processing system 200 may be a personal digital assistant (PDA), which is configured with ROM and/or flash ROM to provide non-volatile memory for storing operating system files and/or user-generated data.

The depicted example in FIG. 2 and above-described examples are not meant to imply architectural limitations. For example, data processing system 200 also may be a notebook computer or hand held computer in addition to taking the form of a PDA. Data processing system 200 also may be a kiosk or a Web appliance.

The processes of the present invention are performed by processor 202 using computer implemented instructions, which may be located in a memory such as, for example, main memory 204, memory 224, or in one or more peripheral devices 226–230.

Figure 3:
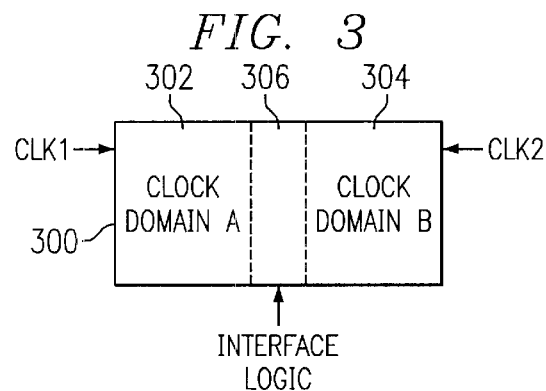
FIG. 3 is a chip with multiple clock domains which may be emulated in accordance with a preferred embodiment of the present invention.

With reference now to FIG. 3, a chip with multiple clock domains is shown in accordance with a preferred embodiment of the present invention. Chip 300 includes clock domain A 302, which operates under control of clock "CLK1," and clock domain B 304, which operates under control of clock "CLK2." Chip 300 also includes interface logic 306, which provides interconnection between clock domain A and clock domain B. Interface logic 306 includes combination logic that interfaces between latches that operate under control of clock "CLK1," and latches that operate under control of clock "CLK2."

Figure 4:
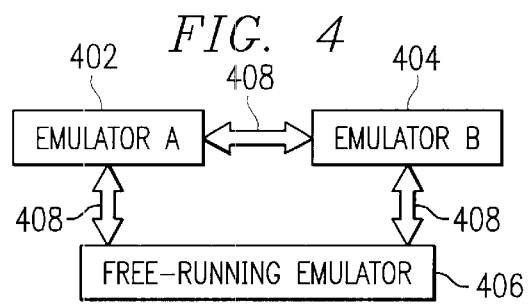
FIG. 4 is a configuration of emulators for emulating a multiple clock domain chip in accordance with a preferred embodiment of the present invention.

Turning now to FIG. 4, a configuration of domains for emulating a multiple clock design, such as chip 300 of FIG. 3, is illustrated in accordance with a preferred 7, embodiment of the present invention. Domain A 402 emulates logic clocked by CLK1, Domain B 404 emulates logic clocked by CLK2, and free-running domain 406 emulates the purely combination input-to-output logic paths in the free-running clock domain. Connectors 408 interconnect the domains.

Each domain 402, 404, 406 may run on a different "processor" in parallel. A "processor" may be a computer, such as computer 100 in FIG. 1 or data processing system 200 in FIG. 2, a processor within a multiprocessing data processing system, or a process in a multitasking environment within a single computer system. Each emulator may be clocked by an independent clock.

With reference now to FIG. 5, a flowchart is shown illustrating the operation of a retiming process in accordance with a preferred embodiment of the present invention. The process of the present invention is a tool that depicts a netlist on a computer screen and colors various components, such as latches and gates, on the display based on the corresponding clock. The process executes on a data processing system, such as data processing system 200 in FIG. 2, to partition the netlist so that components are allocated to an appropriate domain. The process of the present invention picks a unique color for each clock (step 502) and traverses each clock tree coloring the latches in support of that clock tree with that color (step 504). In the example shown in FIG. 3, CLK_A may be assigned a color of "BLUE," CLK_B may be assigned a color of "RED," and the free-running clock may be assigned a color of "BLACK." At this point, all latches in the network should be colored.

The process of the present invention then colors the fanout logic cones for each latch (step 506) by performing a depth-first search from each latch to either a primary output or another latch using the color of the root latch. Designs are typically composed of smaller designs tied together. Primary outputs are outputs of the top most level of the design. The process notes coloring collisions. For each multicolored gate, the process retimes the network (step 508) by moving the terminating latch backwards, towards the collision, to enable single coloring of the gate. This retiming will reduce the number of multicolored gates. A "fanin" to a gate is all the upstream logic that influences the value of the gate's output. The "fanout" of a gate is all the downstream logic that is influenced by the gate's value.

FIG. 6A shows an example circuit with a multicolored gate in accordance with a preferred embodiment of the present invention. The circuit includes gate 602 with an input from the domain corresponding to the BLUE clock and an input from the domain corresponding to the RED clock. The output of gate 602 is fed to latch 604, which is clocked by the BLACK clock. The process of the present invention, in step 508, retimes the circuit of FIG. 6A by moving latch 604 to lie before the gate.

FIG. 6B shows an example of a retimed circuit in accordance with a preferred embodiment of the present invention. In the example shown in FIG. 6B, the latch is duplicated as latches 606, 608, which lie before gate 610. Latch 606 receives the input from the BLUE domain and latch 608 receives the input from the RED domain. Both latches are colored BLACK, because they are clocked by the BLACK clock. Retimed gate 610 receives both inputs from the BLACK domain, therefore, gate 610 is also colored BLACK. Thus, retiming is accomplished by borrowing a latch from the primary output, back through the cone to the collision point. The logic downstream from the borrowed latch is put into the free-run domain to be evaluated at the emulator sample rate. This is valid because the outputs to the emulator are only valid when the step pulse of the fastest domain is low, when the emulator finishes calculating a cycle. Therefore, there is an implicit latch on all outputs of the netlist under emulation even though this is a function of a correct emulator usage model.

Returning now to FIG. 5, the process colors the gates in the retimed network (step 510). The process colors the gates by performing a depth-first search on the fanout logic of each primary input to the first latch encountered or a primary output. If a primary output is encountered, the process colors the path with a color representing the free-run domain. Otherwise, the process colors the path with the color of the terminating latch. The process ignores gates that fan out to two or more domains in this step. The free-run domain thus contains all of the combinational paths that span from input to output without being gated by a system clock.

Thereafter, the process duplicates the fanin cones for any gates that are still multicolored (step 512), so a copy of the logic can be incorporated with each independent domain, and ends. FIG. 7A shows an example circuit with a multicolored gate in accordance with a preferred embodiment of the present invention. The circuit includes gate 702, the output of which feeds latch 704 in the BLUE domain and latch 706 in the RED domain.

FIG. 7B shows an example of a retimed circuit in accordance with a preferred embodiment of the present invention. In the example shown in FIG. 7B, the fanin cone, which comprises gate 702 in FIG. 7A, is duplicated as gate 708 feeding latch 712 in the BLUE domain and gate 710 feeding latch 714 in the RED domain. If the components in the fanin cone are numerous, duplication of the fanin cone may dramatically increase model size. Therefore, the present invention performs this step only after the network is retimed in step 508 in FIG. 5. This technique is also needed when a gate's fanout cone contains a clock domain and a primary output. In this case the duplicated logic feeding the primary output is placed in the free-run domain.

Thus, the present invention solves the disadvantages of the prior art by providing an improved method to partition a design with asynchronous segments that results in a speed-efficient mapping into processor array and FPGA based emulators. The present invention allows for a design to go through an additional round of combinational logic optimization, since the retiming of the latches pushes latches out to the clock domain boundaries. Optimization may be performed before the retiming process of the present invention. Furthermore, after the retiming process of the present invention, additional optimization potential exists, because the number of combinational gates between latches in the same clock domain increases. This optimization allows for smaller emulation designs and faster execution time.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media such a floppy disc, a hard disk drive, a RAM, and CD-ROMs and transmission-type media such as digital and analog communications links.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for retiming a network of components to be emulated in a multiple clock domain circuit including a plurality of latches and a plurality of gates, comprising:

receiving a list of components in the network;

selecting a unique color for each clock in the circuit;

associating each of the plurality of latches with a color corresponding to the clock of each latch;

determining a fanout logic cone for each latch and associating gates in each fanout logic cone with a color of the clock of the corresponding latch;

identifying at least one multicolored gate that falls in a fanout logic cone of more than one clock; and retiming the network to enable the at least one multicolored gate to be associated with only one color.

2. A method, in a data processing system, for retiming a network of components to be emulated in a multiple clock domain circuit including a plurality of latches and a plurality of gates, comprising:

receiving a list of components in the network;

selecting a unique color for each clock in the circuit;

associating each of the plurality of latches with a color corresponding to the clock of each latch;

determining a fanout logic cone for each latch and associating gates in each fanout logic cone with a color of the clock of the corresponding latch;

identifying at least one multicolored gate that falls in a fanout logic cone of more than one clock; and retiming the network to enable the at least one multicolored gate to be associated with only one color, wherein the step of identifying at least one multicolored gate includes performing a depth-first search from a root latch to either a primary output or another latch using the color of the root latch.

3. A method, in a data processing system, for retiming a network of components to be emulated in a multiple clock domain circuit including a plurality of latches and a plurality of gates, comprising:

receiving a list of components in the network;

selecting a unique color for each clock in the circuit;

associating each of the plurality of latches with a color corresponding to the clock of each latch;

determining a fanout logic cone for each latch and associating gates in each fanout logic cone with a color of the clock of the corresponding latch;

identifying at least one multicolored gate that falls in a fanout logic cone of more than one clock; and retiming the network to enable the at least one multicolored gate to be associated with only one color, wherein the step of retiming the network includes moving the terminating latch to the inputs of the multicolored gate.

4. The method of claim 1, further comprising:

performing a depth-first search on a fanout logic path of each primary input until a terminating latch is encountered or a primary output is encountered; and if a primary output is encountered, associating the fanout logic path with a color representing a free-run domain; otherwise, associating the fanout logic path with the color of the terminating latch.

5. The method of claim 1, further comprising:

identifying at least one remaining multicolored gate that fans out to a first domain and a second domain;

duplicating a fanin cone of the at least one remaining multicolored gate to form a first fanin cone and a second fanin cone;

incorporating the first fanin cone with the first domain; and incorporating the second fanin cone with the second domain.

6. The method of claim 1, further comprising:

performing optimization on the network.

7. The method of claim 1, further comprising:

emulating each clock domain on a processor.

8. The method of claim 1, further comprising:

emulating each clock domain on a field programmable gate array.

9. The method of claim 1, further comprising:

displaying the network of components on a display.

10. An apparatus for retiming a network of components to be emulated in a multiple clock domain circuit including a plurality of latches and a plurality of gates, comprising:

receipt means for receiving a list of components in the network;

selection means for selecting a unique color for each clock in the circuit;

coloring means for associating each of the plurality of latches with a color corresponding to the clock of each latch;

determination means for determining a fanout logic cone for each latch and associating gates in each fanout logic cone with a color corresponding to the clock of the appropriate latch;

identification means for identifying at least one multicolored gate that falls in a fanout logic cone of more than one clock; and retiming means for retiming the network to enable the at least one multicolored gate to be associated with only one color.

11. An apparatus for retiming a network of components to be emulated in a multiple clock domain circuit including a plurality of latches and a plurality of gates, comprising:

receipt means for receiving a list of components in the network;

selection means for selecting a unique color for each clock in the circuit;

coloring means for associating each of the plurality of latches with a color corresponding to the clock of each latch;

determination means for determining a fanout logic cone for each latch and associating gates in each fanout logic cone with a color corresponding to the clock of the appropriate latch;

identification means for identifying at least one multicolored gate that falls in a fanout logic cone of more than one clock; and retiming means for retiming the network to enable the at least one multicolored gate to be associated with only one color, wherein the identification means includes means for performing a depth-first search from a root latch to either a primary output or another latch using the color of the root latch.

12. An apparatus for retiming a network of components to be emulated in a multiple clock domain circuit including a plurality of latches and a plurality of gates, comprising:

receipt means for receiving a list of components in the network;

selection means for selecting a unique color for each clock in the circuit;

coloring means for associating each of the plurality of latches with a color corresponding to the clock of each latch;

determination means for determining a fanout logic cone for each latch and associating gates in each fanout logic cone with a color corresponding to the clock of the appropriate latch;

identification means for identifying at least one multicolored gate that falls in a fanout logic cone of more than one clock; and retiming means for retiming the network to enable the at least one multicolored gate to be associated with only one color, wherein the retiming means includes means for moving the terminating latch to the inputs of the multicolored gate.

13. The apparatus of claim 10, further comprising:

means for performing a depth-first search on a fanout logic path of each primary input until a terminating latch is encountered or a primary output is encountered; and means for associating, if a primary output is encountered, the fanout logic path with a color representing a free-run domain;

means for associating, if a terminating latch is encountered, the fanout logic path with the color of the terminating latch.

14. The apparatus of claim 10, further comprising:

means for identifying at least one remaining multicolored gate that fans out to a first domain and a second domain;

means for duplicating a fanin cone of the at least one remaining multicolored gate to form a first fanin cone and a second fanin cone;

means for incorporating the first fanin cone with the first domain; and means for incorporating the second fanin cone with the second domain.

15. The apparatus of claim 10, further comprising:

means for performing optimization on the network.

16. The apparatus of claim 10, further comprising:

means for emulating each clock domain on a processor.

17. The apparatus of claim 10, further comprising:

means for emulating each clock domain on a field programmable gate array.

18. The apparatus of claim 10, further comprising:

display means for displaying the network of components.

19. A computer program product, in a computer readable medium, for retiming a network of components to be emulated in a multiple clock domain circuit including a plurality of latches and a plurality of gates, comprising:

instructions for selecting a unique color for each clock in the circuit;

instructions for associating the plurality of latches with colors corresponding to the clocks of the latches;

instructions for determining a fanout logic cone for each latch and associating gates in each fanout logic cone with a color corresponding to the clock of the appropriate latch;

instructions for identifying at least one multicolored gate that falls in a fanout logic cone of more than one clock; and instructions for retiming the network to enable the at least one multicolored gate to be associated with only one color.

20. A computer program product, in a computer readable medium, for retiming a network of components to be emulated in a multiple clock domain circuit including a plurality of latches and a plurality of gates, comprising:

instructions for selecting a unique color for each clock in the circuit;

instructions for associating the plurality of latches with colors corresponding to the clocks of the latches;

instructions for determining a fanout logic cone for each latch and associating gates in each fanout logic cone with a color corresponding to the clock of the appropriate latch;

instructions for identifying at least one multicolored gate that falls in a fanout logic cone of more than one clock; and instructions for retiming the network to enable the at least one multicolored gate to be associated with only one color, wherein the instructions for identifying at least one multicolored gate includes instructions for performing a depth-first search from a root latch to either a primary output or another latch using the color of the root latch.

21. A computer program product, in a computer readable medium, for retiming a network of components to be emulated in a multiple clock domain circuit including a plurality of latches and a plurality of gates, comprising:

instructions for selecting a unique color for each clock in the circuit;

instructions for associating the plurality of latches with colors corresponding to the clocks of the latches;

instructions for determining a fanout logic cone for each latch and associating gates in each fanout logic cone with a color corresponding to the clock of the appropriate latch;

instructions for identifying at least one multicolored gate that falls in a fanout logic cone of more than one clock; and instructions for retiming the network to enable the at least one multicolored gate to be associated with only one color, wherein the instructions for retiming the network includes instructions for moving the terminating latch to the inputs of the multicolored gate.

22. The computer program product of claim 19, further comprising:

instructions for identifying at least one remaining multicolored gate that fans out to a first domain and a second domain;

instructions for duplicating a fanin cone of the at least one remaining multicolored gate to form a first fanin cone and a second fanin cone;

instructions for incorporating the first fanin cone with the first domain; and instructions for incorporating the second fanin cone with the second domain.

* * * * *